(12) United States Patent
Ku et al.

(10) Patent No.: US 9,343,505 B2
(45) Date of Patent: May 17, 2016

(54) WAFER LEVEL REFLECTOR FOR LED PACKAGING

(71) Applicant: TSMC Solid State Lighting Ltd., Hsinchu (TW)

(72) Inventors: Hao-Wei Ku, Zhudong Township (TW); Chung Yu Wang, Hsinchu (TW); Yu-Sheng Tang, Qishan Township (TW); Hsin-Hung Chen, Hsinchu (TW); Hao-Yu Yang, Taoyuan (TW); Ching-Yi Chen, Hsinchu (TW); Hsiao-Wen Lee, Hsinchu (TW); Chi Xiang Tseng, Kaohsiung (TW); Sheng-Shin Guo, Wufeng Township (TW); Tien-Min Lin, Hsinchu (TW); Shang-Yu Tsai, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 11 days.

(21) Appl. No.: 13/941,784

(22) Filed: Jul. 15, 2013

(65) Prior Publication Data
US 2013/0299855 A1    Nov. 14, 2013

Related U.S. Application Data

(62) Division of application No. 12/910,363, filed on Oct. 22, 2010, now Pat. No. 8,486,724.

(51) Int. Cl.
*H01L 27/15* (2006.01)
*H01L 33/48* (2010.01)
*H01L 33/60* (2010.01)
(Continued)

(52) U.S. Cl.
CPC ............ *H01L 27/15* (2013.01); *H01L 24/97* (2013.01); *H01L 33/486* (2013.01); *H01L 33/60* (2013.01); *H01L 25/167* (2013.01); *H01L 33/54* (2013.01); *H01L 2224/48091* (2013.01); *H01L 2224/48227* (2013.01); *H01L 2224/8592* (2013.01); *H01L 2924/01322* (2013.01); *H01L 2924/10253* (2013.01); *H01L 2924/12035* (2013.01); *H01L 2924/12041* (2013.01); *H01L 2924/1305* (2013.01); *H01L 2924/13091* (2013.01); *H01L 2933/005* (2013.01); *H01L 2933/0033* (2013.01); *H01L 2933/0058* (2013.01)

(58) Field of Classification Search
CPC ............... H01L 2224/48091; H01L 2924/00; H01L 2924/00014; H01L 2224/73265; H01L 25/0753; H01L 33/62; H01L 33/54; H01L 33/60; H01L 33/50; H01L 33/58; H01L 27/15; H01L 24/97; H01L 33/486; H01L 2924/12035; H01L 2924/1305; H01L 2924/10253; H01L 2924/01322; H01L 2924/13091; H01L 2224/48227; H01L 2924/12041
USPC ............................ 257/79–82, 88, 89, 98, 294
See application file for complete search history.

(56) References Cited

U.S. PATENT DOCUMENTS 6,638,780 B2    10/2003    Fukasawa et al.
7,446,347 B2    11/2008    Bogner et al.
(Continued)

*Primary Examiner* — Michelle Mandala
(74) *Attorney, Agent, or Firm* — Muncy, Geissler, Olds & Lowe, P.C.

(57) ABSTRACT

An optical emitter is fabricated by bonding a Light-Emitting Diode (LED) die to a package wafer, electrically connecting the LED die and the package wafer, forming a phosphor coating over the LED die on the package wafer, molding a lens over the LED die on the package wafer, molding a reflector on the package wafer, and dicing the wafer into at least one optical emitter.

1 Claim, 6 Drawing Sheets

(51) Int. Cl.
*H01L 23/00* (2006.01)
*H01L 25/16* (2006.01)
*H01L 33/54* (2010.01)

(56) References Cited

U.S. PATENT DOCUMENTS

| | | |
|---|---|---|
| 7,598,101 B2 | 10/2009 | Park et al. |
| 2006/0227302 A1* | 10/2006 | Harbers et al. ............ 353/94 |
| 2008/0290353 A1* | 11/2008 | Medendorp et al. ......... 257/89 |
| 2009/0321760 A1 | 12/2009 | Kuhmann |
| 2010/0127283 A1* | 5/2010 | van de Ven et al. ......... 257/89 |
| 2010/0155746 A1* | 6/2010 | Ibbetson et al. ............. 257/88 |
| 2011/0006331 A1* | 1/2011 | Shaikevitch ................. 257/98 |
| 2011/0018017 A1 | 1/2011 | Bierhuizen et al. |
| 2011/0031527 A1* | 2/2011 | Kotani et al. ............... 257/100 |

\* cited by examiner

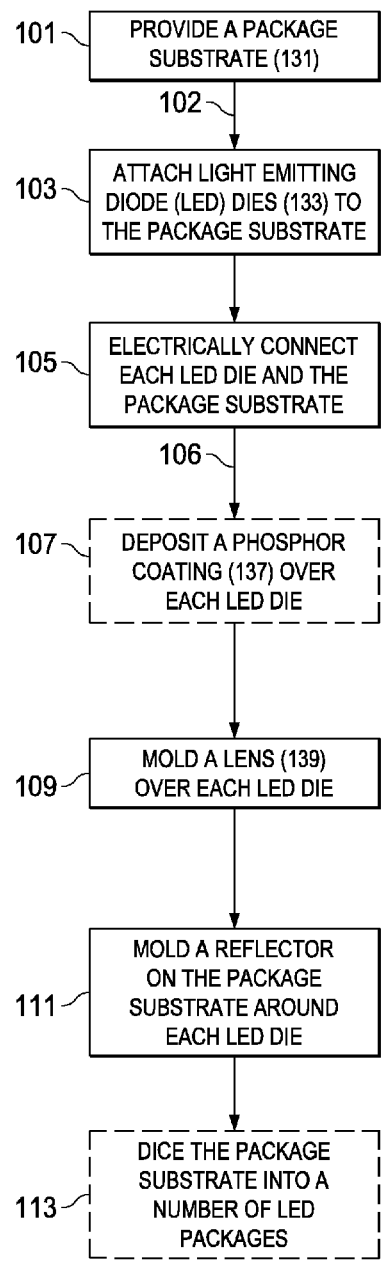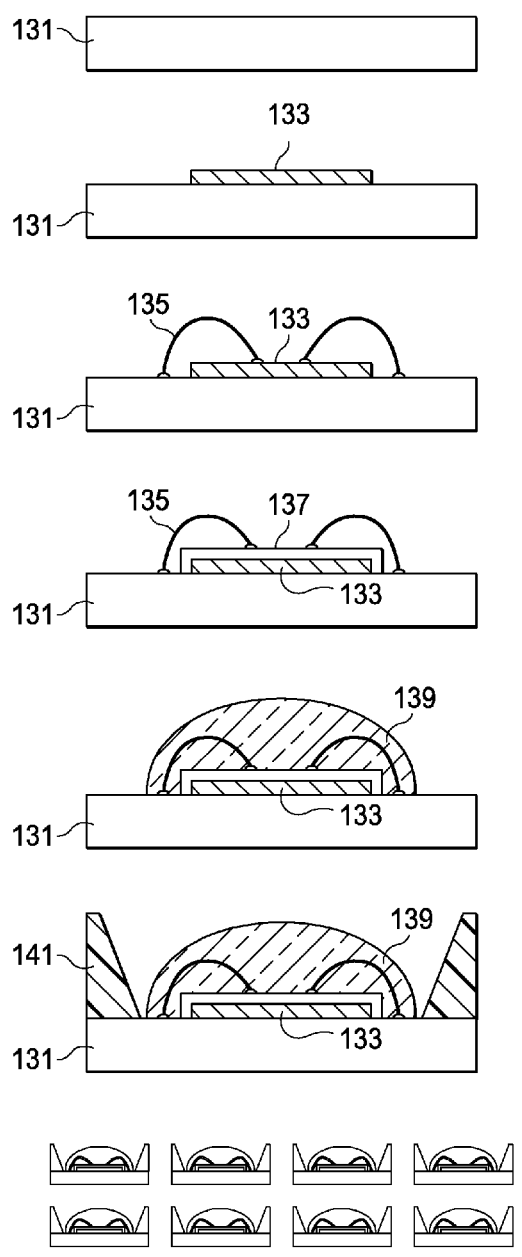
Fig. 1A
Fig. 1B

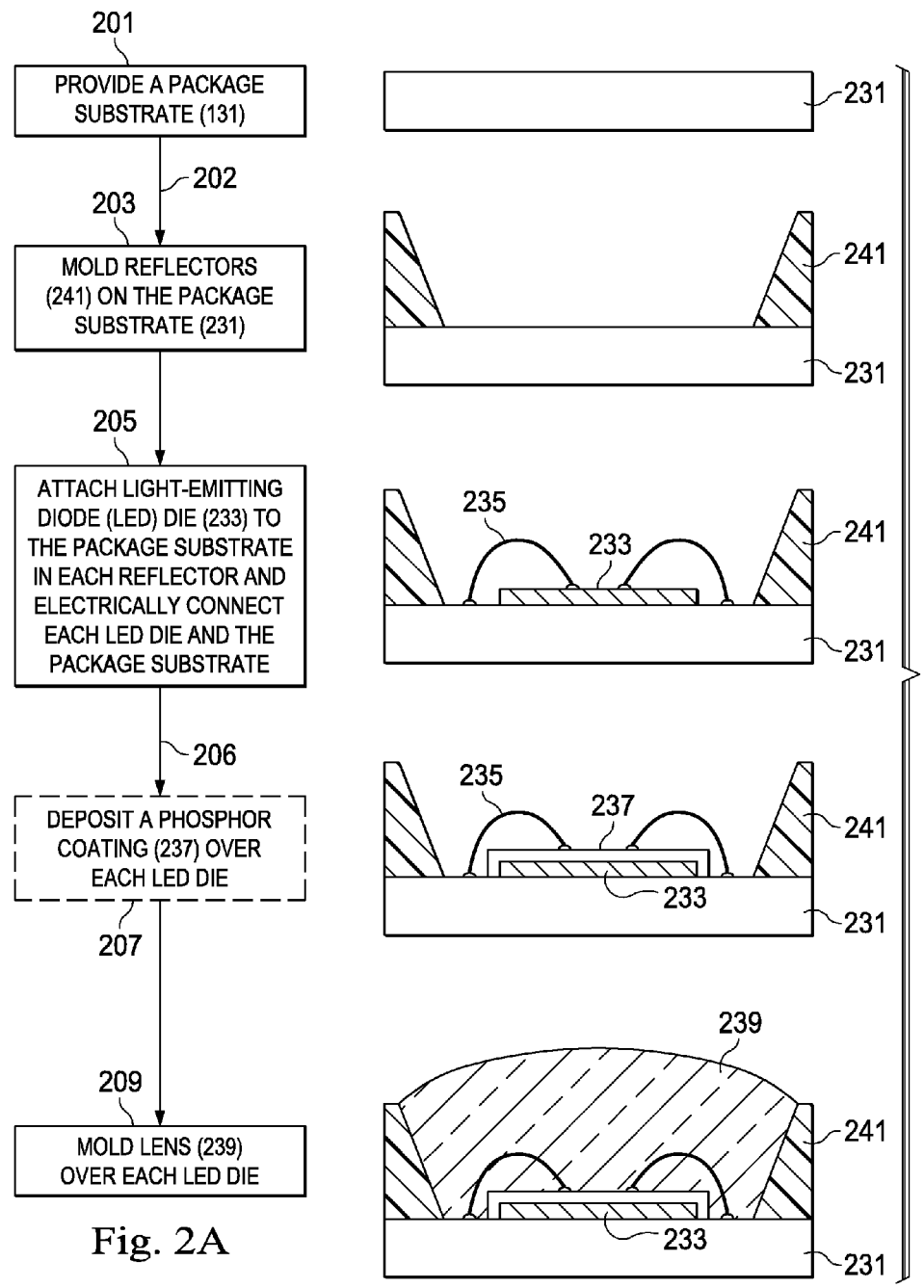

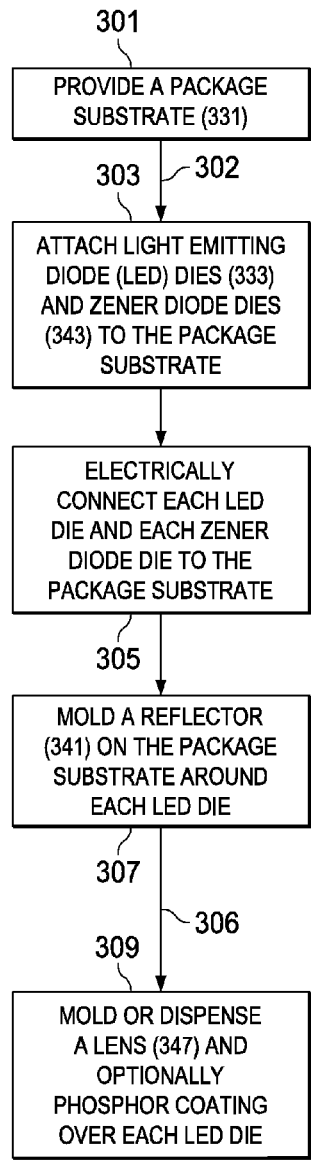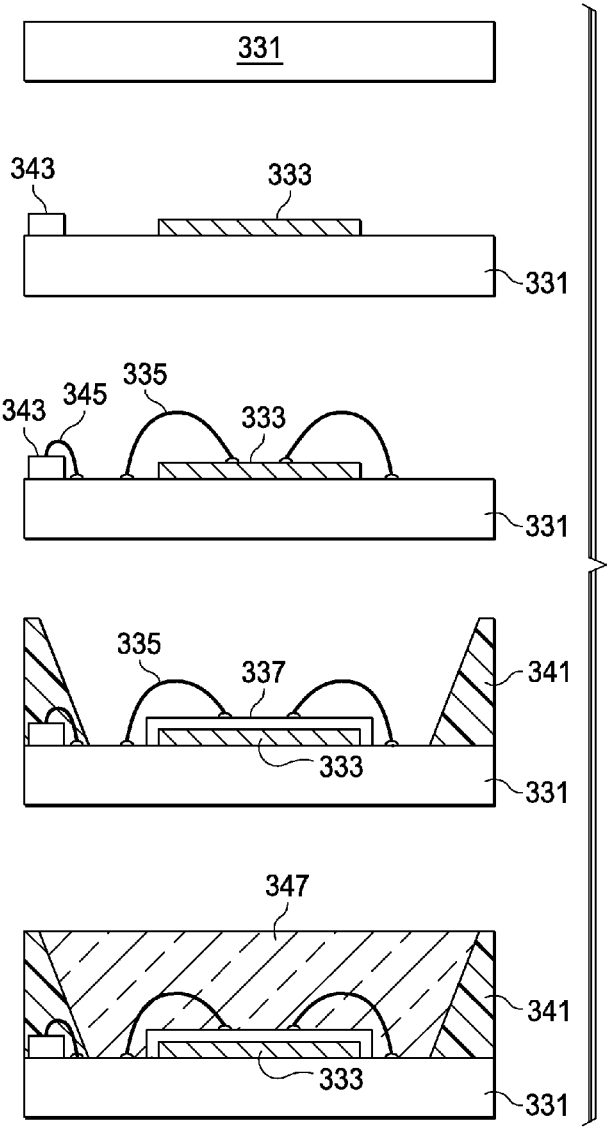
Fig. 3A
Fig. 3B

WAFER LEVEL REFLECTOR FOR LED PACKAGING

PRIORITY DATA

This application is a divisional application of U.S. patent application Ser. No. 12/910,363, filed on Oct. 22, 2010, entitled "WAFER LEVEL REFLECTOR FOR LED PACKAGING," which is issued on Jul. 16, 2013 as U.S. Pat. No. 8,486,724, the disclosure of which is hereby incorporated by reference in its entirety.

TECHNICAL FIELD

The present disclosure relates generally to a semiconductor device, and more particularly, to semiconductor light-emitting diodes (LED).

BACKGROUND

A Light-Emitting Diode (LED), as used herein, is a semiconductor light source for generating a light at a specified wavelength or a range of wavelengths. LEDs are traditionally used for indicator lamps, and are increasingly used for displays. An LED emits light when a voltage is applied across a p-n junction formed by oppositely doped semiconductor compound layers. Different wavelengths of light can be generated using different materials by varying the bandgaps of the semiconductor layers and by fabricating an active layer within the p-n junction.

A phosphor material is usually added to change the properties of light generated by the LED. For example, the monochromatic light provided by an LED can be converted to a polychromatic light through the application of several phosphors, either in a mixture or several phosphor layers. The phosphors Stokes shift blue light or other shorter wavelength light to a longer wavelength. The perception of white may be evoked by generating mixtures of wavelengths that stimulate all three types of color sensitive cone cells (red, green, and blue) in the human eye in nearly equal amounts and with high brightness compared to the surroundings in a process called additive mixing. The white light LED may be used as lighting, such as back lighting for various display devices, commonly in conjunction with a liquid crystal display (LCD).

Traditionally, LEDs are made by growing a plurality of light-emitting structures on a growth substrate. The light-emitting structures along with the underlying growth substrate are separated into individual LED dies. At some point before or after the separation, electrodes or conductive pads are added to each of the LED dies to allow the conduction of electricity through the structure.

Depending on the application in which the light is used, a viewing angle may be specified from which a majority of emitted light must be directed. A generic horizontal LED die emits about half of its light from the top and about half from the sides. LED packaging involves combining the LED die with a reflector structure on a package substrate and forming electrical connections to power and control the final product, which is the optical emitter. A reflector is usually packaged with the LED die to redirect the side emissions and improve total light extraction in a direction away from the package substrate.

While existing methods of packaging an LED have been generally adequate for their intended purposes, they have not been entirely satisfactory in every aspect. More efficient methods and designs that recycle more of the side emissions and improve control of the resulting light generated at all angles continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A, 2A, and 3A are flowcharts illustrating a method of fabricating an optical emitter according to various aspects of the present disclosure;

FIGS. 1B, 2B, and 3B are cross-section illustrations of the optical emitter at various stages of fabrication according to various methods of FIGS. 1A, 2A, and 3A;

SUMMARY

Figure 4A:
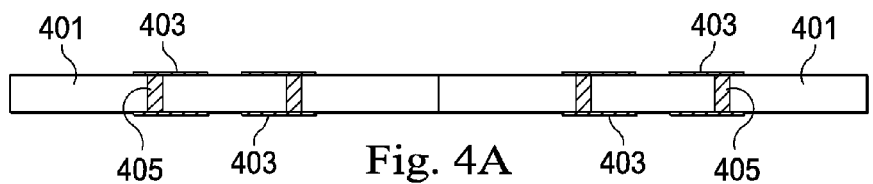
FIGS. 4A to 4D illustrate cross-sectional views of the optical emitter at various stages of reflector molding according to an embodiment of the present disclosure; and, FIGS. 5A to 5G illustrate cross-sectional views of the optical emitter at various stages of reflector molding according to an embodiment of the present disclosure.

One aspect of the present disclosure involves a method of fabricating an optical emitter. The method includes bonding a Light-Emitting Diode (LED) die to a package wafer, electrically connecting the LED die and the package wafer, forming a phosphor coating over the LED die on the package wafer, molding a lens over the LED die on the package wafer and molding a reflector on the package wafer. The reflector may be molded on the package wafer before or after bonding the LED die and may be molded over a Zener diode die bonded to the package wafer.

Another aspect of the present disclosure involves an optical emitter including a Light-Emitting Diode (LED) die, a package wafer attached to one side of the LED die, electrical connections connecting the LED die and the package wafer, a molded lens attached to the package wafer on the LED die, a molded reflector surrounding the LED die attached to the package wafer. The molded reflector is angled to redirect LED side emissions toward a direction away from the package wafer.

These and other features of the present disclosure are discussed below with reference to the associated drawings.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Of course, the description may specifically state whether the features are directly in contact with each other. In addition, the present disclosure may repeat reference numerals and/or letters in the various examples. This repetition is for the purpose of simplicity and clarity and does not in itself dictate a relationship between the various embodiments and/or configurations discussed.

It is understood that the figures have been simplified for a better understanding of the inventive concepts of the present disclosure. Accordingly, it should be noted that additional processes may be provided before, during, and after the methods in the figures, and that some other processes may only be briefly described herein.

A conventional LED package includes an LED die attached to a package substrate and optional phosphor material coating over the LED die or dispersed in encapsulant or lens material. An LED package substrate may be a lead frame or an alumina board. The LED die may be electrically connected to circuitry on the package substrate in a number of ways. One conventional connection method involves attaching the growth substrate side of the die to the package substrate, and forming electrode pads that are connected to the p-type semiconductor layer and the n-type semiconductor layer in a light-emitting structure on the die, and then bond wiring from the electrode pads to contact pads on the package substrate. Another conventional connection method involves inverting the LED die and using solder bumps to connect the electrode pads on the light-emitting structure directly to the package substrate. Yet another conventional connection method involves using hybrid connectors. One semiconductor layer, for example the p-type layer, may be wired bonded to the package substrate while the other layer (n-type layer) may be soldered to the package substrate.

A conventional LED die emits light in all directions; however, as a light source, the optical emitter outputs light only on one side. Frequently, the light emitter is specified with a limited viewing angle. For the purposes of this application, the viewing angle is defined as the total angle within which 90% of the total luminous flux is captured. Because much of the light is emitted in an undesirable direction, reflectors are added to redirect the light toward a desirable direction in an effort to improve overall light extraction.

The side of the LED closest to the package substrate or the top surface of the package substrate is usually designed to reflect light so as to improve light extraction. An optical emitter using a horizontal LED die also has a significant light output in the horizontal direction (side emission), which may be about half of all light output. The light output in the horizontal direction includes not only light emitted by the LED in a horizontal direction, but also total internal reflection (TIR) light. TIR is an optical phenomenon that occurs when a ray of light strikes a boundary between two mediums at an angle larger than a particular critical angle with respect to the normal to the surface. At this larger angle, if the refractive index is lower on the other side of the boundary, no light can pass through and all of the light is reflected. The critical angle is the angle of incidence above, which the total internal reflection occurs. If the angle of incidence is greater (i.e. the ray is closer to being parallel to the boundary) than the critical angle then the light will stop crossing the boundary altogether and instead be totally reflected back internally. TIR occurs in a horizontal die at the boundary of the LED die with a lens, encapsulant, or air.

To redirect this significant side light output so that it is projected within the viewing angle, LED dies are packaged with side reflectors. Side reflectors may be added to the LED package separately as independent reflectors or as a part of the package substrate. Independent reflectors (standalone reflectors) are commercially available and are made for many popular LED designs and applications. Many of these independent reflectors fit onto the LED on the package substrate and may be large compared to the LED die. The use of independent reflectors in LED package may require stocking of a large variety of reflectors for different LED sizes and applications and may be a significant contributor to manufacturing cost. Some reflectors may be integrated with the package substrate. The LED die is then attached to the reflector package substrate with a die attach adhesive. The integrated reflector may be formed of the same material or different material to the package substrate. The integrated reflector also suffers from stocking issues and cannot be used for wafer level packaging.

In wafer level packaging of LED dies, many LED dies are packaged onto a single package wafer at the same time. A package wafer may be a silicon wafer, a silicon carbide wafer, or a glass wafer. The reflectors may be formed in place on the wafer before or after the LED dies are attached and electrically connected. Methods to form reflectors on a wafer include mold injection of polyphthalamide (PPA) resin. PPA resin is fairly easy to use and not expensive. Reflective material is mixed in the PPA resin in a liquid form and injected into a mold on a package wafer. However, as LED power requirements and package life increase, reflectors made using PPA resin experience increased yellowing and adhesion issues. The yellowing of the PPA resin material results from thermal cycling, moisture, and passage of time. The yellowing reduces a total light output of the LED package because reflectivity decreases, reducing light extraction. Compounded by decreased emission from the LED die and conversion efficiency of the phosphor materials over time, the overall light output can decrease dramatically. Adhesion issues result from the different coefficients of thermal expansion (CTE) of the PPA resin and the underlying package wafer to which it is adhered. As the PPA resin and package wafer cycle thermally, crevices form between the PPA resin and the package wafer and cause the reflector to delaminate partially or completely from the package wafer.

Optical emitters in accordance with various embodiments of the present disclosure includes reflectors molded on a package wafer in a wafer level package process using silicone materials. A number of optical emitters are fabricated by bonding a number of Light-Emitting Diode (LED) dies to a package wafer, electrically connecting the LED dies to electrical connection pads on the package wafer, forming a phosphor coating over each of LED die on the package wafer, molding a lens over each LED die on the package wafer, and molding a reflector surrounding each LED die on the package wafer. The reflectors may be molded on the package wafer before or after bonding the LED dies and may be molded over Zener diode dies bonded to the package wafer.

A variety of materials may be used as the reflector. Suitable materials have a viscosity suitable for molding, may be thixotropic, have an appropriate adhesion to the package wafer, have a coefficient of thermal expansion (CTE) similar to that of the package wafer, and have a good thermal conductivity and stability (i.e., do not degrade or change color during thermal cycling). The reflector should be highly reflective, having a reflectivity higher than about 85%, 90%, or 95%. The reflectivity may be a material property inherent to the reflector material or may be a result of a coating or a result of an additive, for example, a white coating or a white additive. Example materials suitable for forming reflectors include certain silicone resins (for example, white silicone resins), epoxy-resins, photoresist, polymers, plastics, and combinations thereof. Suitable materials are flowable for molding into the reflector and can be cured into a defined shape by heat or application of some other energy such as ultraviolet light. One example of a suitable material is KER-2000DAM available from Shin-Etsu Chemical of Japan or T75W15A/F87FW15B white inks available from Teamchem Company of Taiwan or Focus Coat DPR-55FW from Asahi Chemical of Japan.

Certain embodiments of the optical emitter in accordance with the present disclosure include an electro-static discharge (ESD) and/or electrical fast transient (EFT) protection circuit such as a Zener diode die. Other commonly used ESD and EFT protection devices include a transient suppression diode and a multilayer varistor. When packaged in close proximity to the LED die, the ESD and EFT protection circuitries become a part of the optic system, often in undesirable ways. The often-used Zener diode absorbs light and thus decreases light extraction and output. In certain embodiments of the present disclosure, the Zener diode is located under a portion of the molded reflector. This way, the Zener diode die is not a part of the optic system because it is not exposed to the light emission from the LED die directly.

The optical emitter may be a standalone device or a part of an integrated circuit (IC) chip or system on chip (SoC) that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Illustrated in FIG. 1A is a flowchart of a method for fabricating an optical emitter in accordance with the present disclosure. FIG. 1B provides fragmentary cross-sectional side views of an optical emitter during various fabrication stages in accordance with the process flow in FIG. 1A. Referring to FIGS. 1A and 1B, the method begins with block 101 where is package wafer 131 is provided. The package wafer 131 may be silicon or glass that is suitable for wafer level packaging. The package wafer 131 may include conductor and/or dielectric patterns (including pads, trenches, and vias), through vias filled or partially filled with conductive material, scribe lines, alignment marks, and other features designed for the optical emitter packaging process. The package wafer 131 may be cleaned first in operation 102. Cleaning operation 102 may involve using a plasma, such as an oxygen plasma.

In operation 103, Light-Emitting Diode (LED) dies are attached to the package wafer. FIG. 1B shows cross-sectional views of one LED die 133 attached to package wafer 131; however, many LED dies 133 are attached to a package wafer, the number depends on the sizes of the LED dies and the package wafer. An LED die includes a light-emitting structure (not shown) and one or more electrode pads for electrically connecting to a package wafer, the details of which are not shown in FIG. 1B. The light-emitting structure has two doped layers and a multiple quantum well layer, also referred to as the active layer, between the doped layers. The doped layers are oppositely doped semiconductor layers. In some embodiments, a first doped layer includes an n-type gallium nitride material, and the second doped layer includes a p-type gallium nitride material. In other embodiments, the first doped layer includes a p-type gallium nitride material, and the second doped layer includes an n-type gallium nitride material. A multiple quantum well (MQW) layer includes alternating (or periodic) layers of active material, for example, gallium nitride and indium gallium nitride. For example, in one embodiment, the MQW layer includes ten layers of gallium nitride and ten layers of indium gallium nitride, where an indium gallium nitride layer is formed on a gallium nitride layer, and another gallium nitride layer is formed on the indium gallium nitride layer, and so on and so forth.

The doped layers and the MQW layer are all formed by epitaxial growth processes on a growth substrate, which may be made of silicon, silicon carbide, gallium nitride, or sapphire. After the completion of the epitaxial growth processes, a p-n junction (or a p-n diode) is essentially formed. When an electrical voltage is applied between the doped layers, an electrical current flows through the light-emitting structure, and the MQW layer emits light. The color of the light emitted by the MQW layer is associated with the wavelength of the emitted radiation, which may be tuned by varying the composition and structure of the materials that make up the MQW layer. The light-emitting structure may optionally include additional layers such as a buffer layer between the growth substrate and the first doped layer, a reflective layer, and an ohmic contact layer. A suitable buffer layer may be made of an undoped material of the first doped layer or other similar material. A light-reflecting layer may be a metal, such as aluminum, copper, titanium, silver, alloys of these, or combinations thereof. An ohmic contact layer may be an indium tin oxide (ITO) layer. The light reflecting layer and ohmic contact layer may be formed by a physical vapor deposition (PVD) process or a chemical vapor deposition (CVD) or other deposition processes.

The LED dies may be attached to the package wafer in a number of ways. In certain embodiments where the growth substrate side of the LED die is attached to the package wafer, the attachment may be performed by simply gluing the LED die using any suitable conductive or non-conductive glue, depending on whether the side of the LED die and the package wafer to be attached are conductive and whether isolation is required. In embodiments where the LED die side opposite of the growth substrate is attached to the package wafer, the attachment may include electrically connecting the LED die by bonding electrode pads on the LED to contact pads on the package wafer. This bonding may involve soldering or other metal bonding. In some embodiments, the growth substrate is removed and one side of the LED die is bonded and electrically connected to the contact pads on the wafer. In this case the attaching may be accomplished using metal bonding such as eutectic bonding.

After the LED dies are attached to the wafer, each LED die is electrically connected to the package wafer in operation 105 of FIG. 1A. At least two electrical connections are made per LED die, one each to the p-type and n-type doped layers. In some cases, two electrical connections are made to the p-type layer for current spreading purposes. As discussed, the electrical connection may involve wire bonding, soldering, metal bonding, or a combination of these to electrical connection pads on the package wafer. FIG. 1B shows wire bonding connections 135 between the LED die 133 attached to a package wafer 131. Because the electrical connection 135 may take a variety of forms, the structure shown in FIG. 1B is illustrative only—the electrical connections 135 need not be a wire bond.

Before an optional phosphor coating is deposited over the LED dies in operation 107, the package wafer 131, LED dies 133 and electrical connections 135 may be cleaned in operation 106 to remove any oxide build up or residual particles from previous processing. Cleaning operation 106 may involve using a plasma, such as an oxygen plasma. In some embodiments, the phosphor coating 137 is dispensed or sprayed onto a surface of the LED die 133 in a concentrated viscous fluid medium, such as glue, and dried or cured in place. The phosphor coating 137 may conformally cover the LED die 133 so that when a current is passed through the LED die 133, the light emitted by the LED die is transmitted through the phosphor material 137. In other embodiments, phosphor material is added as a component of other elements of the optical emitter, for example, the lens material as an additive, or may fill the space between the LED die and the lens. The phosphor material converts a portion of the light emitted to a light of a different wavelength and allows a portion of the light to pass through. Together, the passed through light and the converted light are perceived. Although a white light is usually generated this way, the concepts may be used to generate light of any color.

In operation 109, a lens 139 is molded over each LED die. The lens molding may be performed by placing a lens mold over the package wafer 131 and the LED dies 133, inserting a lens precursor material in each lens mold cavity, curing the lens precursor material, and then removing the lens mold. One lens mold having many lens mold cavities may be used for the package wafer, or several lens molds may be used at the same time on the package wafer. The package wafer may include alignment marks between individual LED dies to ensure that the mold cavities are placed accurately over the LED die.

The lens mold may include multiple openings for inserting the lens precursor material and for evacuating the cavities. To ensure a good fill, the gas inside the mold cavities may be evacuated through one or more openings. The gas inside the mold cavity may be air or an inert gas such as nitrogen. Alternatively, this operation is performed in a vacuum environment. The lens precursor material may be heated or under pressure. The lens precursor material fills the mold cavities to form the lenses 139.

The lenses 139 are cured to set so that it retains its shape and adhere to the package wafer and LED dies. Radiation or other energy is applied to the lens mold that transmits the radiation or other energy. The radiation may be an ultraviolet (UV) radiation, thermal radiation (infrared), microwave, or another radiation that can cure the lens precursor material. Lens precursor material that cure under UV light or under heat application are commercially available. Conductive heat energy may be applied through the package wafer or through heating of the lens mold.

After the lenses 139 have cured, the lens mold may be removed. The lens mold is removed so as not to remove the lenses 139 from the package wafer. In one embodiment, some gas can be added via one or all of the mold openings to help separate the lenses 139 from the lens mold. Other techniques include using a removal template or sheath between the lenses 139 and the lens mold, or changing the temperature of either the molded lens or the lens mold such that a temperature difference exists. FIG. 1B shows the partially fabricated optical emitter having a lens 139 molded onto the LED die 133 on package wafer 131. Note that while the lens shape shown in FIG. 1B is that of a portion of an ellipsoid, other shapes may be used.

In operation 111 of FIG. 1A, reflectors are molded on the package wafer, one for each LED die. The reflectors 141 may be molded on the package wafer using the same process as the processes for the lenses 139 or different processes. In some embodiments, the reflectors 141 are formed using injection molding processes. In injection molding processes, a reflector mold is placed over the package wafer 131 and its mold cavities are centered over each LED die 133. A reflector precursor material is injected in the mold to form the reflectors 141. After the reflectors have set, the reflector mold is removed. Suitable materials for the reflector have been discussed above.

According to some embodiments, the reflector molding of operation 111 and lens molding of operation 109 are performed using the same mold in the same or separate operations. In the same operation, a mold having separate cavities for the lens and the reflector is used. When the reflector precursor material contains the reflective particles, separate mold injections are performed, once for the clear lens precursor material and once for the reflective reflector precursor material. In some embodiments, the same precursor material is used and the mold may include a common plenum from which the lens cavities and the reflector cavities connect. However, the reflectors formed using the same precursor material, as the lens must be coated separately with a reflective material in a separate operation. Reflective material may be a white coating, for example paint with a white additive. Suitable white additive material includes various metal oxides having a white color, such as titanium oxide, aluminum oxide, zirconium oxide, or combinations of these and other additives. In some embodiments, the curing after the mold injection occurs simultaneously for both the lenses and the reflectors. In other embodiments, the lenses are formed completely before the reflectors, or vice versa.

At this point, the package wafer includes a number of LED packages or optical emitters. According to some embodiments, the number of optical emitters packaged on a package wafer may be sold and shipped as is, with final processing to incorporate the optical emitter in an application apparatus performed elsewhere.

In other embodiments, the optical emitters are separated from each other and further processing may be performed before shipping. Referring back to FIGS. 1A and 1B, in operation 113 the package wafer is optionally diced into a number of separate optical emitters. Further processing may include encapsulating, adding external leads/wires, and final binning.

FIGS. 2A/2B, and 3A/3B illustrate a variety of embodiments of the basic concepts described above in association with FIGS. 1A and 1B. The remaining discussion focuses on the differences from embodiments already discussed and similar details are not repeated. Referring to FIGS. 2A and 2B, a method and optical emitter cross sections for packaging optical emitters in a wafer level process is illustrated. In operation 201, a package wafer 231 is provided, which may be similar to that provided in operation 101 of FIG. 1A. The package wafer may be cleaned in operation 202, which may be a process similar to that of operation 102 of FIG. 1A.

In operation 203, reflectors 241 are molded on the package wafer according to an LED die pattern. The reflectors may be formed in an injection molding process or a compression molding process. FIGS. 4A to 4D illustrate various operations of an injection molding process and FIGS. 5A to 5G illustrate various operations of a compression molding process.

Figure 4B:
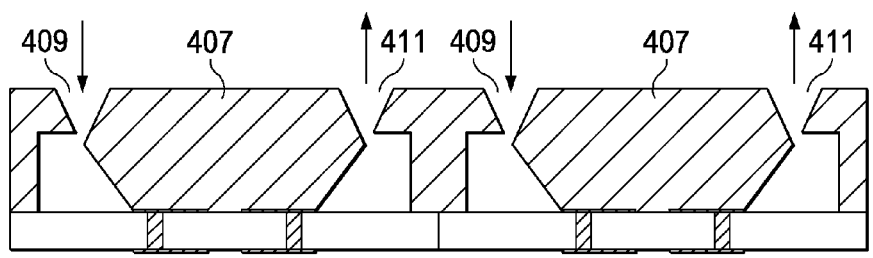

FIGS. 4A to 4D illustrate various operations and side views of an injection molding process in accordance with certain embodiments of the present disclosure. FIG. 4A illustrates the package wafer 401, which includes conductive pads 403 on one side of the package wafer and through vias 405 filled with a conductive material connecting to another conductive pad on the opposite side of the package wafer 401. FIG. 4B shows a reflector molding 407 on the package wafer. The reflector molding 407 includes openings 409 and 411 that are used to insert or remove material from the reflector cavities. In one example, reflector precursor material may be inserted in one or more openings such as opening 409 and gas or air may be removed via one or more openings 411 during the injection molding process. Alternatively, the injection may occur in a vacuum so that no gas or air removal is required. The reflector mold may include various channels and plenums for flowing the reflector precursor material.

Figure 4C:
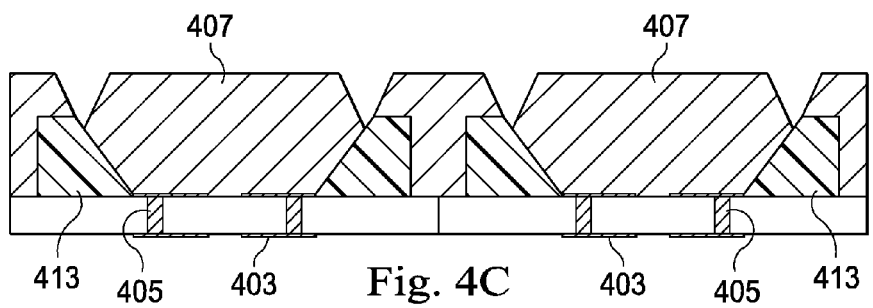
Figure 4D:
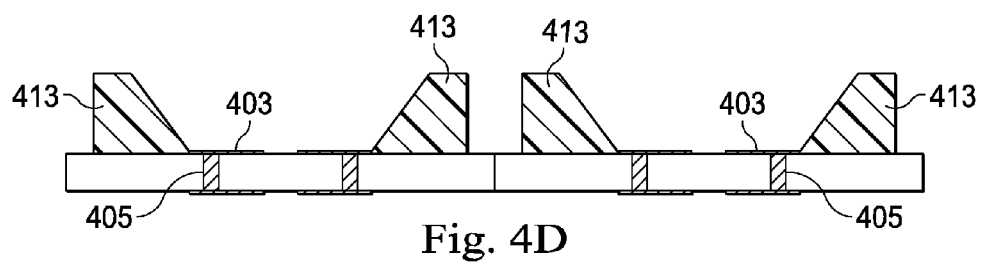

After a controlled amount of reflector precursor material is injected, the reflector is cured with the molding in place as shown in FIG. 4C. As discussed the curing process may involve heating or adding radiation energy to the reflector precursor through the molding. Because the reflector precursor material is added after the reflector molding is already in place, no reflector precursor material contacts the metal contacts 403 and hence no residual film is formed. After the reflectors are formed, the reflector molding is removed to result in the package wafer and reflectors of FIG. 4D.

Figure 5A:
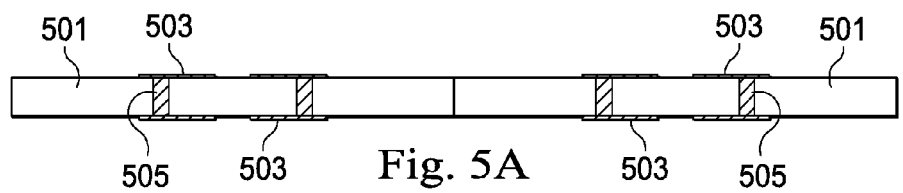
Figure 5B:
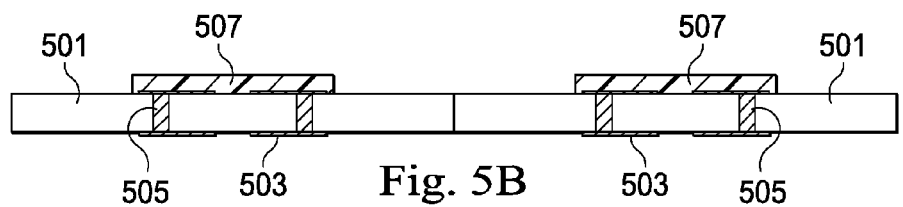

The package wafer 501 of FIG. 5A may be the same as the package wafer 401 of FIG. 4A. The conductive pads, also referred to herein as contact pads, are protected with a protective layer 507 as shown in FIG. 5B. The protective layer may be photoresist, or another easy to remove material that can be selectively deposited. The photoresist may be deposited and patterned to cover a region larger than the conductive pads 503.

Figure 5C:
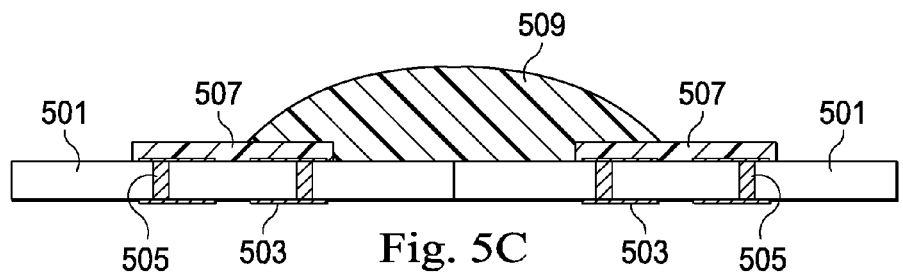

FIG. 5C illustrates the package wafer with the protective layer and a dispensed reflector precursor material 509. The reflector precursor material may be white silicone resins, epoxy-resins, polymers, or plastics that can be cured into a defined shape. As shown, the reflector precursor material 509 is a highly viscous liquid or solid that can be pressure molded. Reflective material or white material may be added to clear silicone resins to obtain a reflector precursor material. Suitable white material includes various metal oxides having a white color, such as titanium oxide, aluminum oxide, zirconium oxide, or combination of these and other additives. Note that a reflector precursor material for compression molding may not necessarily be suitable for injection molding.

Figure 5D:
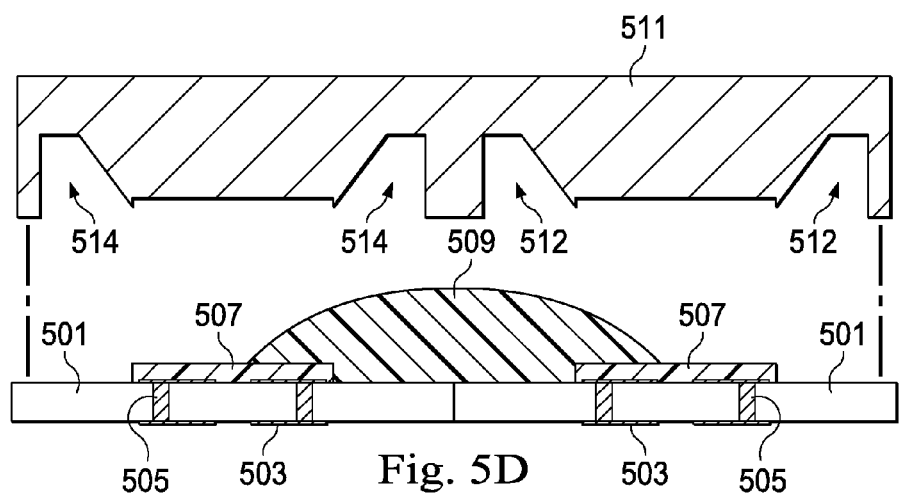
Figure 5E:
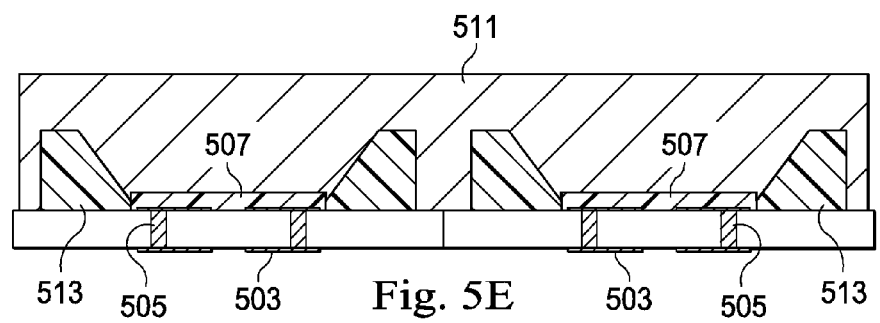

FIG. 5D illustrates a reflector mold 511 having defined reflector cavities 512 and 514. Although only two reflector cavities are shown on reflector mold 511, the reflector mold can have many reflector cavities. In some embodiments all reflectors on an entire package wafer are molded using one reflector mold having a number of reflector cavities equaling the total number of optical emitters to be packaged. The reflector mold is pressed or compressed into the dispensed reflector precursor material and defines the shape of the reflectors as shown in FIG. 5E by applying pressure to the reflector precursor material through the reflector mold. Care must be taken to dispense an amount of reflector precursor material such that the reflector shapes are defined properly. The reflector precursor material is then cured with the mold in place. Depending on the reflector precursor material used, curing may involve adding thermal energy, radiation energy, or the mere passage of time.

Figure 5F:
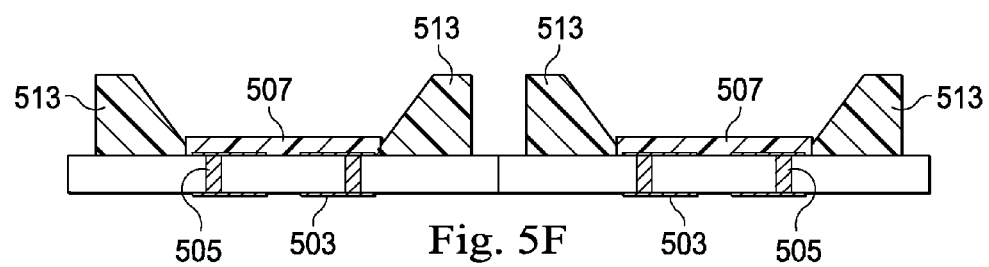

A partial cure may be performed to define the reflector shape before removing the protective layer 507. A final curing to harden the reflector is performed after the protective layer 507 has been removed. After the reflectors have cured (either a partial cure or full cure), the reflector mold is removed as shown in FIG. 5F. Because the reflector precursor material flows over the protective layer 507 during the compression molding process, a thin layer of cured reflector material remains over the protective layer 507. Depending on the amount of reflector precursor material dispensed and the pressure applied during the molding process, the residual film thickness may be controlled to a degree. If a protective layer 507 is not used and the residual film is left over the conductive pads, the residual film can be very hard to clean without damaging the reflectors already formed. Alternatively or in addition, the reflector precursor material may be selected such that a minimum thickness is required to properly cure. A thinner film such as that of the residual film above the protective layer 507 would then break apart when the mold is removed or under curing conditions. In some embodiments, the residual film may be cleaned or etched first used a light cleaner such as sodium bicarbonate ($NaHCO_3$).

Figure 5G:
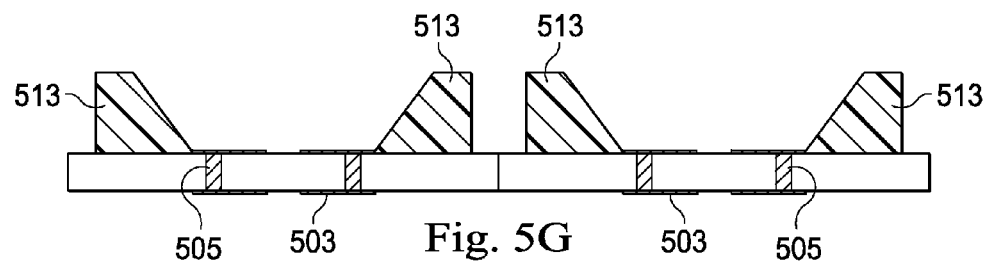

The protective layer 507 is then removed. Care is taken to not damage the reflector and the metal contact underlying the protective layer 507. Different chemicals may be used depending on the type of metal used. For aluminum contacts, hydroxylamine or other amine based stripper may be used. For copper or silver contacts, a semi-aqueous or aqueous chemistry based on dimethyl sulfoxide (DMSO) or fluorine and including dilute concentrations of one or more of hydrofluoric acid, hydrochloric acid, and hydrogen peroxide may be used. An example of a suitable stripper is EKC-162 available from Dupont of Wilmington, Del. A small amount of the reflector, less than 1%, may be removed during stripping. After photoresist removal, the package wafer with the reflectors is as illustrated in FIG. 5G. A final curing may then be performed to harden the reflectors.

Referring back to FIGS. 2A and 2B, after the reflectors are formed in operation 203, LED dies 233 are attached to the package wafer 231 within each reflector 241 and electrical connections 235 are made to metal contacts (not shown) on the package wafer 231. The partially fabricated optical emitters on the package wafer may undergo cleaning at this point in operation 206 before an optional phosphor coating layer 237 is dispensed, sprayed, or otherwise deposited on each LED die. In some embodiments, the phosphor coating 237 may be dispensed before the electrical connections 235 are made.

In operation 209, a lens 239 is molded over each LED die on the package wafer 231 as described in association with operation 109 of FIG. 1A. The lens shown has a shape different from that of lens 139 of FIG. 1B. Note that the lens shape may completely fill or partially fill an interior space of reflectors. The top surface of the lens may be flat at a level higher or lower than the top of the reflectors or may be curved. The package wafer at this point includes a number of operable optical emitters that may be separated or diced into individual devices.

LEDs are electronic components that are sensitive to both external sources of overvoltage transients such as electrostatic discharge (ESD) and electrical fast transients (EFT). Various protections circuits may be added to the LED package to protect the LED die in an overvoltage transient event. Particularly, Zener diodes are commonly used to protect fragile LEDs against an ESD surge. A Zener diode is a type of diode that permits current not only in the forward direction like a normal diode, but also in the reverse direction of the voltage is larger than the breakdown voltage. Zener diodes are connected to the LED die in parallel. During normal operation in an LED lit state, the forward current passes through the LED because the breakdown voltage of the Zener diode (connected in reverse) is larger than the forward voltage of the LED. In a reverse ESD pulse event, the current would pass through the Zener diode because the breakdown voltage of an LED is greater than the forward voltage of the Zener diode.

In an LED package, the Zener diode is commonly placed very close to the LED die and connected in parallel with the LED. However, the Zener diode die is known to absorb light emitted by the LED die. Light absorption by the Zener diode reduces total light output and may increase heating of the optical emitter. To prevent the Zener diode die from absorbing light from the LED die, the various embodiments of the present disclosure involves packaging the Zener diode die under a portion of the molded reflector remove the Zener diode die from being exposed to the light emission from the LED die.

FIGS. 3A and 3B illustrate embodiments where a Zener diode die is packaged under a portion of the molded reflector. In operation 301, a package wafer 331 is provided. LED dies 333 and Zener diode dies 343 are attached to the package wafer 331 in operation 303 according to a LED die pattern. The Zener diode may be attached to the package wafer by an adhesive. Next, electrical connections (335, 345) are made between the LED die 333 and conductive pads on the package wafer 331 and between the Zener diode die 343 and conductive pads on the package wafer 331 in operation 305. Note that although wires are shown in FIG. 3B, the electrical connections need not be made by wires—one or more of the electrical connections may be made directly through soldering, bumps, eutectic bonding, or gluing by a conductive adhesive.

In operation 307, reflectors 341 are molded on the package wafer 331 around each LED die 337 and over the Zener diode die. As discussed above, injection molding or compression molding may be used to form reflectors over Zener diode dies. Regardless of which molding process is used, care must be taken to not adversely impact the electrical connection between the Zener diode die and the package wafer. For example, wire bonding may become detached during the molding process.

In alternative embodiments, the LED dies and the Zener diode dies may be attached to the package wafer in different operations. For example, the Zener diode dies may be attached, electrically connected and the reflectors formed over the Zener diode dies before the LED dies are attached. In some compression molding embodiments where a protective layer is deposited before reflector molding, the LED die may be attached after the protective layer is removed.

In operation 306, the partially fabricated optical emitter may be cleaned. In operation 309, a lens and optionally a phosphor coating may be formed over each LED die. The lens 347 may be molded or dispensed after the phosphor coating.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. It is understood, however, that these advantages are not meant to be limiting, and that other embodiments may offer other advantages. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. An apparatus, comprising:
a package wafer;
a light-emitting diode (LED) die disposed on the package wafer;
a phosphor coating covering the LED die conformally;
a molded lens disposed over the package wafer, wherein the LED die and the phosphor coating are housed under the molded lens; and
a molded reflector disposed over the package wafer and formed a cavity, wherein the LED, the phosphor coating, and the molded lens are located in the cavity and spaced apart from the molded reflector, wherein the molded reflector has a sloped cross-sectional profile such that light emitted by the LED die can be reflected by the molded reflectors in a direction away from the package wafer.

* * * * *